(12) United States Patent
Wei

(10) Patent No.: US 6,232,199 B1
(45) Date of Patent: May 15, 2001

(54) METHOD FOR FORMING A MULTI-CYLINDER CAPACITOR

(75) Inventor: Houng-chi Wei, Lo Tung (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/588,716

(22) Filed: Jun. 7, 2000

(30) Foreign Application Priority Data

Mar. 27, 2000 (TW) .................................................. 89105628

(51) Int. Cl.⁷ .................................................. H01L 21/20

(52) U.S. Cl. ............................................................ 438/396

(58) Field of Search ............................. 438/396, 397–99, 438/386–395, 381, 239–256

(56) References Cited

U.S. PATENT DOCUMENTS 6,022,772 * 2/2000 Watanabe et al. ................... 438/238

* cited by examiner

Primary Examiner—Charles Bowers
Assistant Examiner—Craig Thompson
(74) Attorney, Agent, or Firm—Bacon & Thomas, PLLC

(57) ABSTRACT

The invention has disclosed a method for forming a multi-cylinder capacitor with simplified steps. First, first and second insulating layers are sequentially formed on a semiconductor substrate. Next, an alternate polysilicon layer is deposited. The alternate polysilicon layer includes a plurality of undoped polysilicon films alternating with a plurality of doped polysilicon films. Thereafter, a portion of said plurality of doped polysilicon films is selectively etched by utilizing the etching selectivity between said plurality of undoped and doped polysilicon films. Finally, the second insulating layer is removed and the undoped polysilicon films are doped to form multi-cylinder electrodes. According to the invention, the reliability of the multi-cylinder capacitor is improved and the cost of production is reduced. In addition, it is not necessary to add other steps if the number of cylindrical electrodes increases.

17 Claims, 4 Drawing Sheets

METHOD FOR FORMING A MULTI-CYLINDER CAPACITOR

FIELD OF THE INVENTION

The invention relates to a method for forming a multi-cylinder capacitor, and more particularly to utilizing the etching selectivity between doped and undoped polysilicon films to form a capacitor having a plurality of cylindrical electrodes.

BACKGROUND OF THE INVENTION

In a semiconductor memory such as a dynamic random access memory (DRAM), each of the memory cells typically consists of a MOS transistor and a capacitor. As the area occupied by each of the memory cells is reduced, the integration of the memory cells on a semiconductor chip is increased. In general, a reduction in the area occupied by the capacitor results in a decrease in the capacitance of the capacitor. However, it is necessary that the capacitance of the capacitor used in a DRAM is at least 25 fF(femto-Farad).

In order to satisfy the requirement of high integration in the semiconductor memory, various capacitor structures for reducing the area occupied while keeping the capacitance constant have been rapidly developed in recent years. More specifically, capacitors with three-dimensional structures such as the stack capacitor, the cylinder capacitor, and the pin capacitor have been proposed and fabricated.

In IEEE Transactions on Electron Devices, Vol. 38, No. 2, Toru Kaga et al. have disclosed a cylinder capacitor with an extremely high integration, which is effectively applicable to the semiconductor memory, and its manufacturing process. In addition, another cylinder capacitor and its manufacturing process have been disclosed in U.S. Pat. No. 5,866,450. The conventional cylinder capacitors will be described in the following paragraphs with reference to FIGS. 1(a) to 1(c).

FIGS. 1(a) to 1(e) are cross-sectional views showing the process of manufacturing a multi-cylinder capacitor according to the prior art. In FIG. 1(a), a first insulating layer 2 and a second insulating layer 3 are sequentially deposited on a substrate 1 by a conventional Chemical Vapor Deposition (CVD) method. The substrate 1 is provided with a MOS transistor (not shown) before the steps of depositing. Next, through the conventional processes of photolithography and etching, the second insulating layer 3 is selectively etched to form a first opening 4 using the first insulating layer 2 as an etching stop. Then, the first insulating layer 2 is selectively etched to form a second opening 5, having a smaller diameter than that of the first opening 4, for exposing a source/drain region (not shown) of the MOS transistor.

If the first and second insulating layers 2, 3 are made of the same material, then a barrier layer may be deposited on the first insulating layer 2 before the second insulating layer 3 is deposited thereon. The barrier layer serves as the etching stop while the second insulating layer 3 is selectively etched.

In FIG. 1(b), a first polysilicon film 6 is deposited by CVD to fill out the second opening 5 and to cover the first and second insulating layers 2, 3. Thereafter, a third insulating layer 7 such as a silicon oxide layer is deposited on top of the first polysilicon film 6.

Next, as shown in FIG. 1(c), the third insulating layer 7 is selectively etched to form a cylindrical spacer 7a on the sidewall of the first polysilicon film 6, and then a second polysilicon film 8 is deposited over the first polysilicon film 6 and the cylindrical spacer 7a.

Referring to FIG. 1(d), the second polysilicon film 8 is selectively etched to form a second cylindrical electrode 8a next to the cylindrical spacer 7a. Thereafter, the first polysilicon film 6 is etched to form a first cylindrical electrode 6a through a photoresist (not shown) formed over the opening 4, and then the photoresist is removed.

At last, referring to FIG. 1(e), the cylindrical spacer 7a and the second insulating layer 3 are removed by selective etching, and a multi-cylinder capacitor, specifically a double-cylinder capacitor, according to the prior art is achieved.

It is possible to increase the total surface area of the electrodes of the capacitor without reducing the integration of the semiconductor memory due to the presence of the cylindrical portion of the multi-cylinder capacitor. Therefore, the multi-cylinder capacitor is a good candidate for the advanced semiconductor memory with a very large integration.

However, the manufacturing processes of the multi-cylinder capacitor disclosed in IEEE Transactions on Electron Devices, Vol. 38, No. 2 and U.S. Pat. No. 5,866,450 are complicated because in using them to manufacture the capacitor it is necessary to deposit the third insulating layer 7 and to form the cylindrical spacer 7a by selectively etching the third insulating layer 7. If more cylindrical electrodes are required to further increase the total surface area of the electrodes of the capacitor due to the application of the high-density MOS memory, then the complicated nature of the process for manufacturing the multi-cylinder capacitor according to the prior art is more apparent. In other words, a step for depositing a forth insulating layer and a step for selectively etching the forth insulating layer to form a second cylindrical spacer are both additionally required if a three-cylinder capacitor is formed. Therefore, in accordance with the prior art, two additional steps are necessary for increasing the number of cylindrical electrode of the multi-cylinder capacitor by one. This increase in manufacturing steps causes a reduction in the reliability of the multi-cylinder capacitor and an increase in the cost of production.

SUMMARY OF THE INVENTION

It is therefore an object of the invention to provide a method for forming a multi-cylinder capacitor with simplified manufacturing steps so as to improve the reliability of the multi-cylinder capacitor and reduce the cost of production.

It is another object of the invention to provide a method for forming a multi-cylinder capacitor without additional steps while increasing the number of cylindrical electrodes.

A method according to the invention to form a multi-cylinder capacitor comprises the following steps. First, a first insulating layer is formed on a semiconductor substrate, and then a second insulating layer is formed on the first insulating layer. The second insulating layer is etched to form a first opening, and then the first insulating layer is etched to form a second opening. Thereafter, an alternate polysilicon layer is deposited over the second opening, the first opening, and the second insulating layer. The alternate polysilicon layer includes a plurality of undoped polysilicon films alternating with a plurality of doped polysilicon films. A portion of the alternate polysilicon layer is removed in such a way that a portion of the alternative polysilicon layer remains in the first and second opening. A portion of the plurality of doped polysilicon films is selectively etched to expose the sidewalls of at least one of the plurality of undoped polysilicon films by utilizing the etching selectivity between the plurality of undoped and doped polysilicon films. At last, the second insulating layer is removed and the plurality of undoped polysilicon films is doped so as to become conductive. The multi-cylinder capacitor according to the invention is thereby achieved.

BRIEF DESCRIPTION OF THE DRAWINGS

The above and other objects, features, and advantages of the invention will become more apparent from the following detailed description of the embodiments when taken in conjunction with the accompanying d wings, wherein.

DETAILED DESCRIPTION OF THE PREFERRED EMBODIMENTS

An embodiment of a two-cylinder capacitor according to the invention will now be described in detail referring to FIGS. 2(a) to 2(f).

Figure 1A:
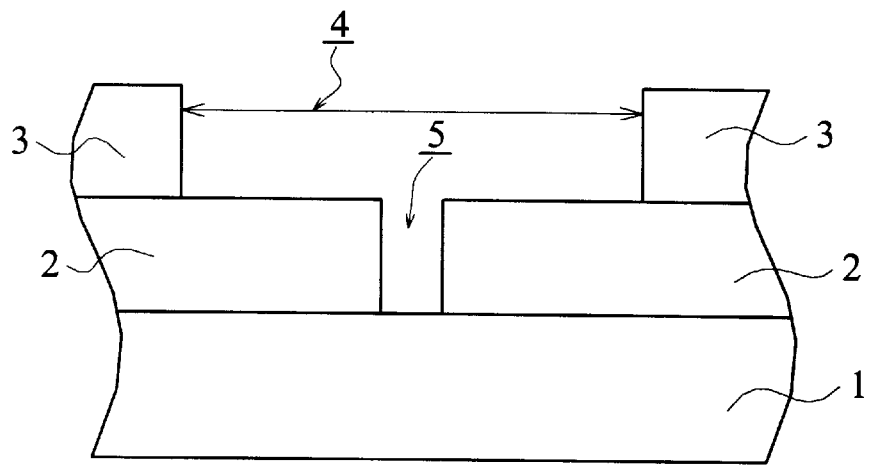
FIGS. 1(a) to 1(e) are cross-sectional views showing a process for fabricating a multi-cylinder capacitor according to the prior art.
Figure 1B:
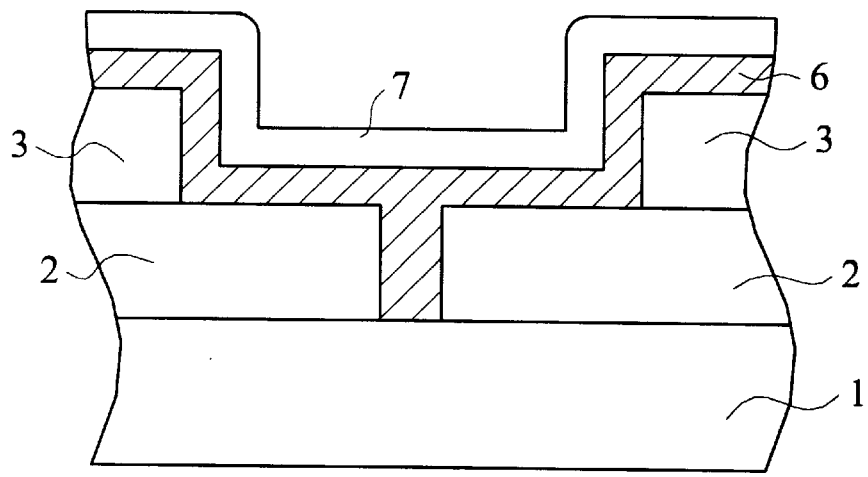
Figure 1C:
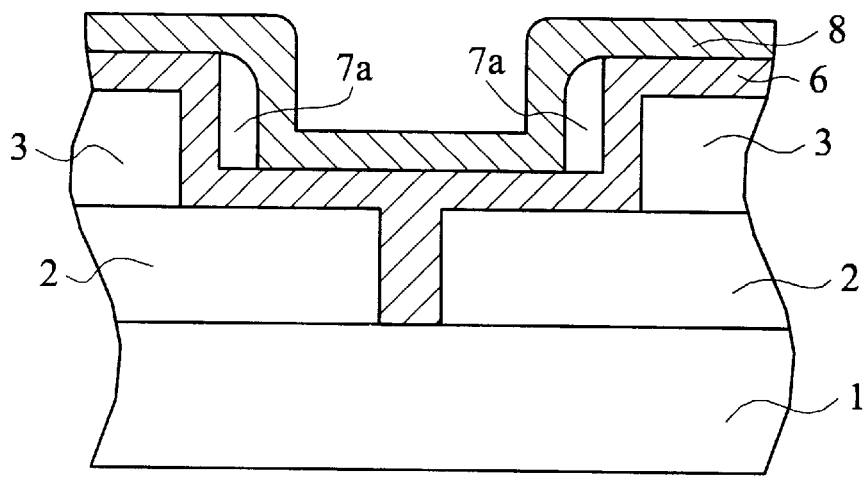
Figure 1D:
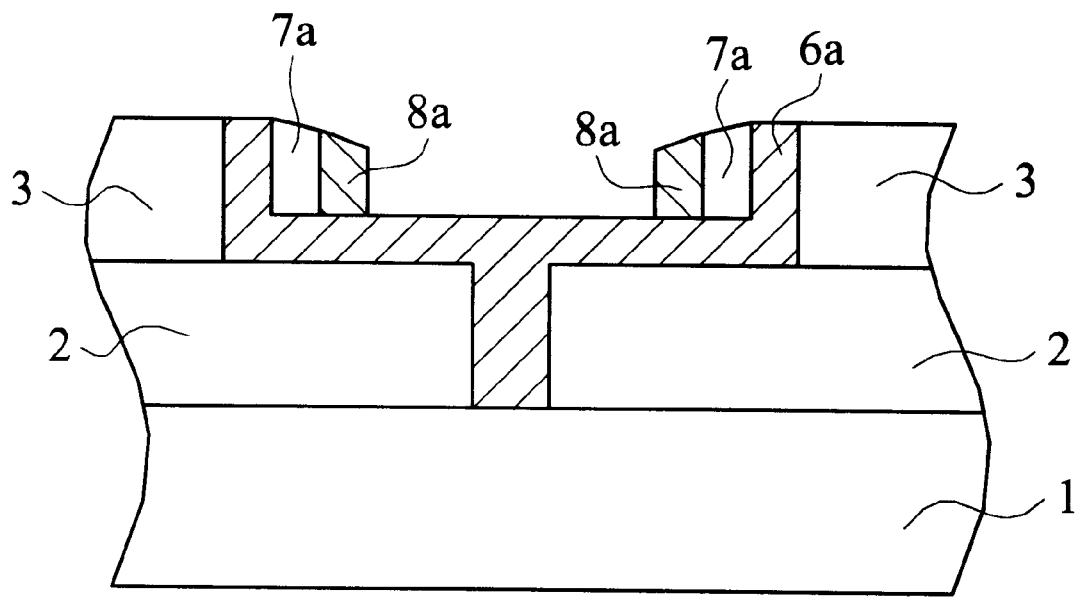
Figure 1E:
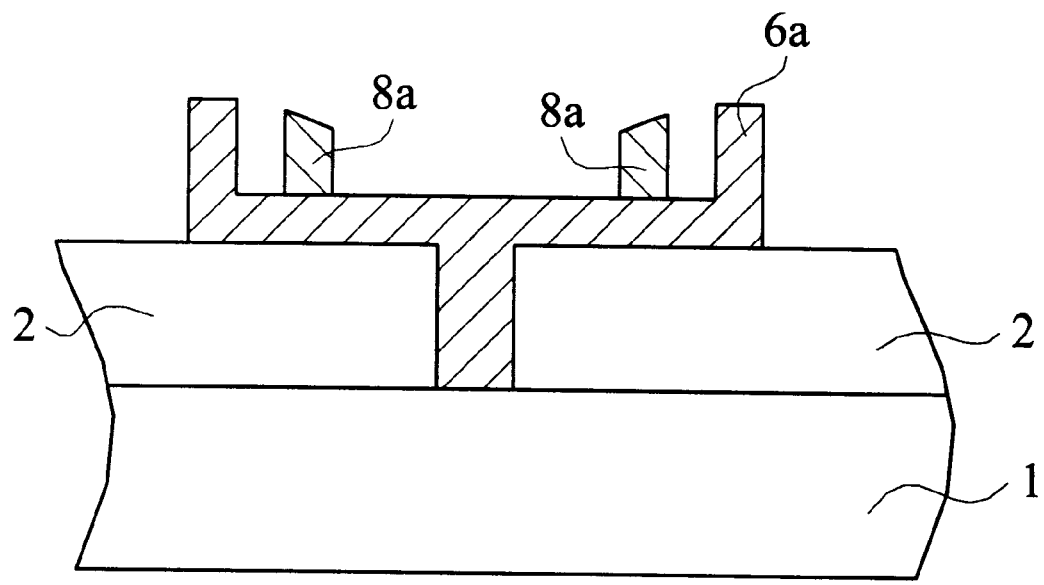
Figure 2A:
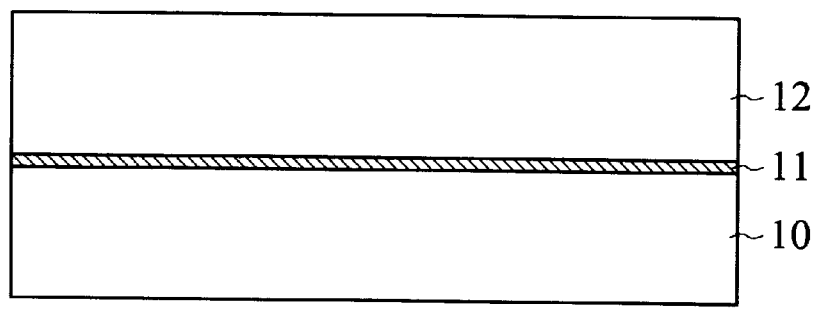
FIGS. 2(a) to 2(f) are cross-sectional views showing a process for fabricating a multi-cylinder capacitor according to the invention.

In FIG. 2(a), a barrier layer 11 and a second insulating layer 12 are sequentially deposited on a first insulating layer 10. The first insulating layer 10 is provided on a semiconductor substrate (not shown) in which a MOS transistor (not shown) is formed. In the embodiment, the first and second insulating layers 10, 12 are made of the same material, for example, silicon oxide, and the barrier layer 11 is made of, for example, silicon nitride. The barrier layer 11 is used as an etching stopper while the second insulating layer 12 is etched in a later step because the etching rate of silicon nitride is lower than that of silicon oxide. Therefore, the barrier layer 11 is optional if the second insulating layer 12 is made of a material with a lower etching rate than that of the first insulating layer 10. More specifically, the first insulating layer 10 may be made of silicon oxide and the second insulating layer 12 may be made of silicon nitride, for example, without the need for the barrier layer 11. In this case, the first insulating layer 10 serves as the etching stop while the second insulating layer 12 is etched in a later step.

Figure 2B:
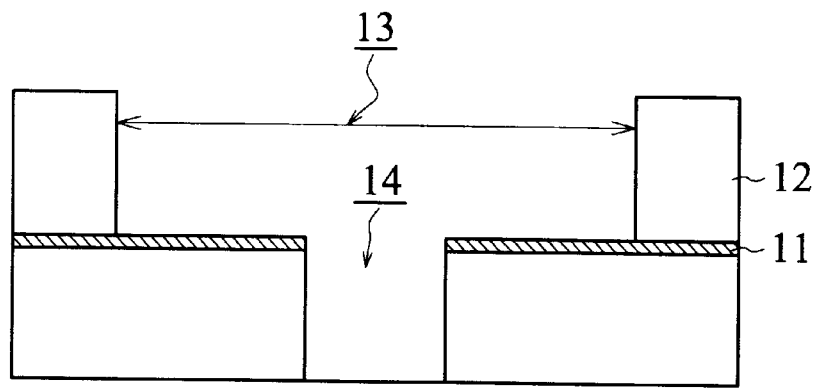

Referring to FIG. 2(b), using the barrier layer 11 as the etching stop, a first opening 13 is formed in the second insulating layer 12 through etching the second insulating layer 12 by the processes of photolithography and etching. Next, a second opening 14 is formed in the first insulating layer 10 to expose a source/drain region (not shown) on the MOS transistor by the processes of photolithography and etching. The second opening 14 has a smaller diameter than that of the first opening 13.

Figure 2C:
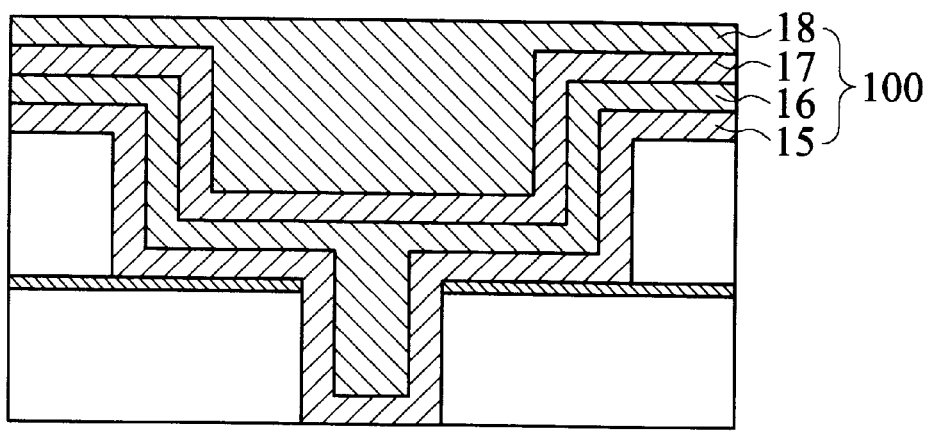

Referring to FIG. 2(c), an alternate polysilicon layer 100 is deposited over the second insulating layer 12, the first opening 13, and the second opening 14 by alternately depositing undoped polysilicon films 15, 17 and doped polysilicon films 16, 18. This alternate deposition step is implemented in a conventional low pressure chemical vapor deposition (LPCVD) furnace (not shown) by controlling the $PH_3$ on/off gas flow ratio of the $Si_2H_6$ gas flow. The $PH_3$ gas flow contains P atoms used as the dopant for the doped polysilicon films 16, 18. In the embodiment, as shown in FIG. 2(c), the alternate polysilicon layer 100 comprises four polysilicon films 15, 16, 17, 18: two undoped polysilicon films 15, 17 alternating with two doped polysilicon films 16, 18. However, the alternate polysilicon layer 100 shown in FIG. 2(c) is taken as an example for describing the invention. In other words, as to the multi-cylinder capacitor according to the invention, the number of the undoped and doped polysilicon films is not limited to four and can be of any desired number. The number of the cylindrical electrodes of the multi-cylinder capacitor according to the invention depends on the number of undoped and doped polysilicon films, as described below.

Figure 2D:
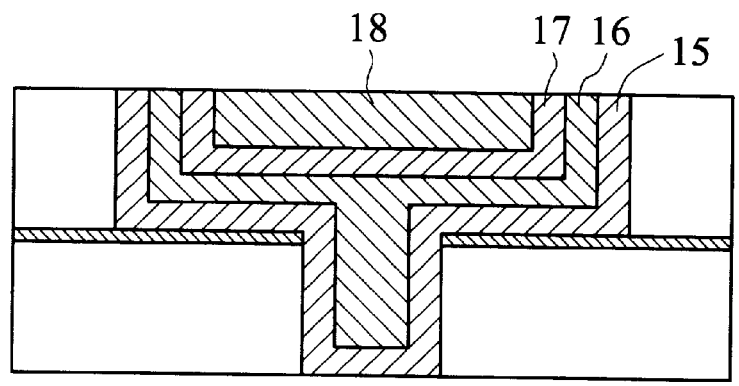
Figure 2E:
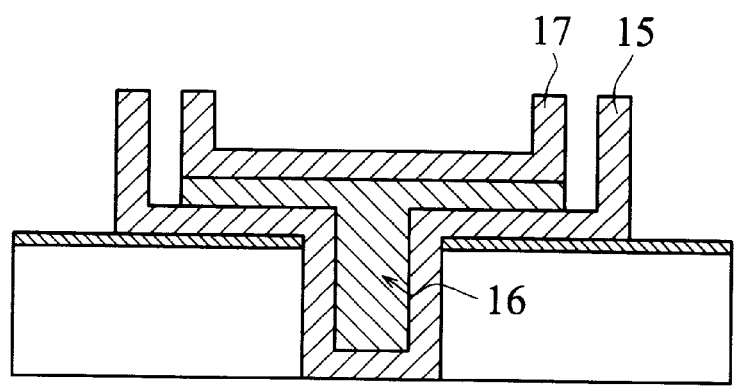

After the alternate polysilicon layer 100 is deposited, a portion of the alternate polysilicon layer 100 is removed by a conventional Chemical Mechanical Polishing (CMP) method in such a way that a portion of the alternate polysilicon layer 100 remains only in the first and second openings 13, 14. As a result, the second insulating layer 12 is exposed, as shown in FIG. 2(d).

Referring to 2(e), using a solution containing $HNO_3$, HF, and de-ionized water as a chemical etchant, the doped polysilicon films 16, 18 are selectively etched due to the etching selectivity between the doped polysilicon films 16, 18 and the undoped polysilicon films 15, 17. The doped polysilicon films 16, 18 are etched faster than the undoped polysilicon films 15, 17. As a result, the sidewalls of the undoped polysilicon films 15, 17 are exposed after the step of selective etching. Then, the second insulating layer 12 is removed in such a way that the polysilicon films 15, 16, 17 form a two-cylinder structure.

Figure 2F:
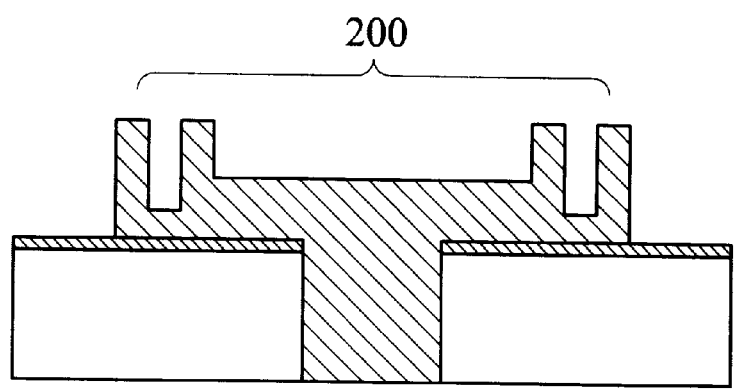

Finally, referring to FIG. 2(f), using $POCl_3$ gas, the undoped polysilicon films 15, 17 are diffusely doped by a conventional doping process in a furnace (not shown). After the doping, the polysilicon films 15, 17 are transformed to doped polysilicon films with a conductive property. As a result, a two-cylinder capacitor 200 according to the invention is achieved through the polysilicon films 15, 17 together with the doped polysilicon film 16. It is noted that the two-cylinder capacitor 200 may be annealed to improve conductivity after the doping step.

Accordingly, the invention has disclosed a method for forming a multi-cylinder capacitor by utilizing the etching selectivity between the undoped and doped polysilicon films. Compared with the prior art, there are fewer complicated steps needed to deposit and etch the insulating layers in the invention. Therefore, according to the invention, the cost of production is reduced and the reliability of the multi-cylinder capacitor is enhanced. Moreover, when the required number of the cylindrical electrodes increases, it is easy and sufficient to achieve this requirement by depositing the required undoped and doped polysilicon films through controlling the $PH_3$ on/off gas flow ratio during the formation of the alternate polysilicon layer. It is not necessary to take any other additional manufacturing steps.

Although the invention has been described in detail, it should be understood that various changes, substitutions and alterations could be made thereto without departing from the spirit and scope of the invention as defined by the appended claims.

What is claimed is:

1. A method for forming a multi-cylinder capacitor, comprising the following steps:

forming a first insulating layer on a semiconductor substrate;

forming a second insulating layer on said first insulating layer;

etching said second insulating layer to form a first opening;

etching said first insulating layer to form a second opening;

alternately depositing a plurality of undoped polysilicon films and a plurality of doped polysilicon films to form an alternate polysilicon layer over said second opening, said first opening, and said second insulating layer;

removing a portion of said alternate polysilicon layer such that a portion of said alternative polysilicon layer remains in said first and second opening;

selectively etching a portion of said plurality of doped polysilicon films to expose the sidewalls of at least one of said plurality of undoped polysilicon films by utilizing the etching selectivity between said plurality of undoped and doped polysilicon films;

removing said second insulating layer; and doping said plurality of undoped polysilicon films.

2. A method according to claim 1, wherein the diameter of said first opening is larger than that of said second opening.

3. A method according to claim 1, wherein said semiconductor substrate is provided with a source/drain region on a transistor.

4. A method according to claim 3, wherein said second opening exposes said source/drain region.

5. A method according to claim 1, wherein said step of doping said plurality of undoped polysilicon films is implemented by using $POCl_3$ gas in a furnace.

6. A method according to claim 1, further comprising a step of heating said alternate polysilicon layer to enhance the conductivity thereof after said step of doping said plurality of undoped polysilicon films.

7. A method according to claim 1, wherein said step of selectively etching said portion of said plurality of doped polysilicon films is implemented by using a solution containing $HNO_3$, HF, and de-ionized water as chemical etchant.

8. A method according to claim 1, wherein said step of depositing said alternate polysilicon layer is implemented by controlling the $PH_3$ on/off gas flow ratio of the $Si_2H_6$ gas flow in a low pressure chemical vapor deposition furnace.

9. A method for forming a multi-cylinder capacitor, comprising the following steps:

forming a first insulating layer on a semiconductor substrate;

forming a barrier layer on said first insulating layer;

forming a second insulating layer on said barrier layer;

etching said second insulating layer to form an first opening;

etching said barrier layer and said first insulating layer to form a second opening;

alternately depositing a plurality of undoped polysilicon films and a plurality of doped polysilicon films to form an alternate polysilicon layer over said second opening, said barrier layer, said first opening, and said second insulating layer;

removing a portion of said alternate polysilicon layer such that a portion of said alternative polysilicon layer remains in said first and second opening;

selectively etching a portion of said plurality of doped polysilicon films to expose the sidewalls of at least one of said plurality of undoped polysilicon films by utilizing the etching selectivity between said plurality of undoped and doped polysilicon films;

removing said second insulating layer; and doping said plurality of undoped polysilicon films.

10. A method according to claim 9, wherein said barrier layer is made of silicon nitride.

11. A method according to claim 9, wherein the diameter of said first opening is larger than that of said second opening.

12. A method according to claim 9, wherein said semiconductor substrate is provided with a source/drain region of a transistor.

13. A method according to claim 12, wherein said second opening exposes said source/drain region.

14. A method according to claim 9, wherein said step of doping said plurality of undoped polysilicon films is implemented by using $POCl_3$ gas in a furnace.

15. A method according to claim 9, further comprising a step of heating said alternate polysilicon layer to enhance the conductivity thereof after said step of doping said plurality of undoped polysilicon films.

16. A method according to claim 9, wherein said step of selectively etching said portion of said plurality of doped polysilicon films is implemented by using a solution containing $HNO_3$, HF, and de-ionized water as a chemical etchant.

17. A method according to claim 9, wherein said step of depositing said alternate polysilicon layer is implemented by controlling the $PH_3$ on/off gas flow ratio of $Si_2H_6$ gas flow in a low pressure chemical vapor deposition furnace.

* * * * *